United States Patent [19]

Miyatake et al.

[11] Patent Number: 5,241,575
[45] Date of Patent: Aug. 31, 1993

[54] SOLID-STATE IMAGE SENSING DEVICE PROVIDING A LOGARITHMICALLY PROPORTIONAL OUTPUT SIGNAL

[75] Inventors: Shigehiro Miyatake, Osaka; Kenji Takada, Neyagawa; Jun Hasegawa, Minamiashigara; Yasuhiro Nanba, Toyonaka, all of Japan

[73] Assignee: Minolta Camera Kabushiki Kaisha, Osaka, Japan

[21] Appl. No.: 942,349

[22] Filed: Sep. 9, 1992

Related U.S. Application Data

[63] Continuation of Ser. No. 630,307, Dec. 19, 1990, abandoned.

[30] Foreign Application Priority Data

Dec. 21, 1989 [JP] Japan ................. 1-334472

[51] Int. Cl.$^5$ .............. H01L 29/78; H01L 27/14; H01L 31/00
[52] U.S. Cl. ........................ 377/60; 377/62; 257/226; 257/234; 257/236; 257/292; 257/448; 257/462; 257/901; 307/308; 307/311; 307/571; 307/580
[58] Field of Search ............ 357/30; 257/290, 292, 257/443, 448, 461, 462, 901, 226, 234, 236; 307/580, 308, 311, 571; 377/60, 62

[56] References Cited

U.S. PATENT DOCUMENTS

| | | | |
|---|---|---|---|
| 4,085,411 | 4/1978 | Genesi | 307/311 |
| 4,384,300 | 5/1983 | Iizuka | 307/291 |
| 4,447,746 | 5/1984 | Fang et al. | 257/290 |
| 4,473,836 | 9/1984 | Chamberlin | 357/30 |
| 4,584,606 | 4/1986 | Nagasaki | 358/209 |
| 4,598,414 | 7/1986 | Dries et al. | 377/58 |
| 4,742,238 | 5/1988 | Sato | 250/578 |
| 4,742,380 | 5/1988 | Chang et al. | 357/30 |
| 4,745,446 | 5/1988 | Cheng et al. | 357/30 |
| 4,791,396 | 12/1988 | Nishizawa et al. | 357/30 |
| 4,841,349 | 7/1989 | Nakano | 357/30 |
| 4,845,355 | 7/1989 | Nakagawa et al. | 357/30 |
| 4,857,725 | 8/1989 | Goodnough et al. | 307/311 |
| 4,901,129 | 2/1990 | Hynecek | 357/30 |
| 4,973,833 | 11/1990 | Takada et al. | 250/208.1 |
| 4,990,981 | 2/1991 | Tanaka et al. | 357/30 |
| 5,034,625 | 7/1991 | Min et al. | 307/296.2 |
| 5,136,184 | 8/1992 | Deevy | 307/491 |

FOREIGN PATENT DOCUMENTS 1-253960 10/1989 Japan .

Primary Examiner—Andrew J. James
Assistant Examiner—Ngan Van Ngo
Attorney, Agent, or Firm—Price, Gess & Ubell

[57] ABSTRACT

An image sensing device that outputs a signal logarithmically proportional to the intensity of the incident light. The image sensing device makes use of a sub-threshold current flowing between the drain and source of a MOS transistor when the gate voltage is below the threshold voltage (above which the MOS transistor is nominally conductive and below which nominally non-conductive). Since the logarithmic conversion is done in the photosensing section of a solid-state image sensing device, the output from the device is already compressed and is easily handled by a small capacity CCD. Some output systems for the image sensing device of the present invention are also described.

4 Claims, 7 Drawing Sheets

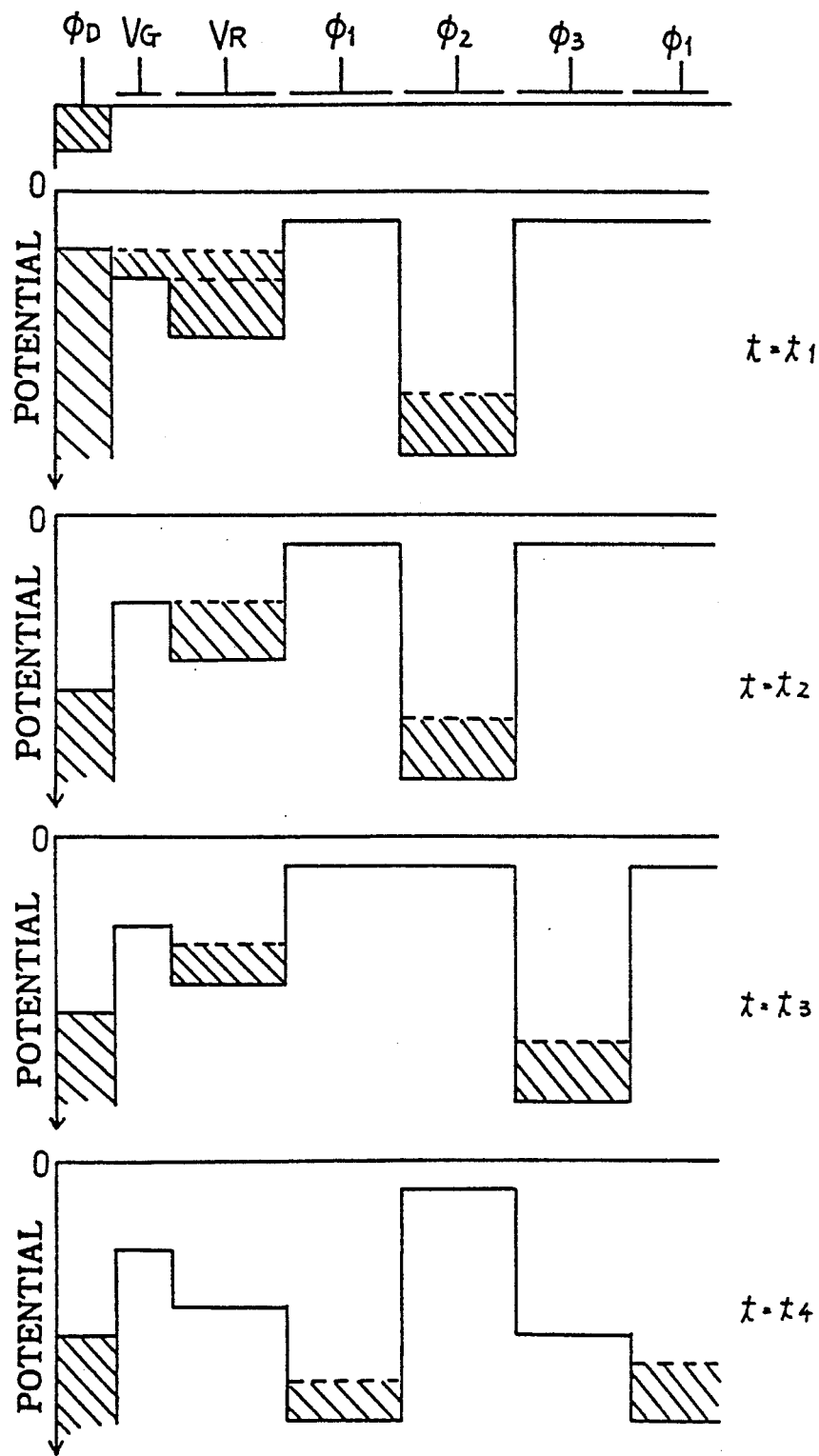

SOLID-STATE IMAGE SENSING DEVICE PROVIDING A LOGARITHMICALLY PROPORTIONAL OUTPUT SIGNAL

This is a continuation of application Ser. No. 07/630,307 filed on Dec. 19, 1990 now abandoned.

BACKGROUND OF THE INVENTION

The present invention relates to a solid-state image sensing device, i.e., a device that converts light into electrical signal, especially a non-linear image sensing device whose conversion characteristic is compressive.

Solid-state image sensing device can be very small, light-weight and consumes less power. It has further advantages such that it is free from distortion in the image field and robust against sticking, vibration or strong external magnetic field. Since the solid-state chip can be manufactured by the same or similar process as that of general LSIs (Large Scale Integrated circuits), it can be mass-produced with high reliability. Thus, solid-state image sensing devices are widely used in many fields: for example, a linear image sensing device is used in a tele-facsimile machine and a two-dimensional image sensing device is used in a video recorder.

One of few shortcomings of the solid-state image sensing device is that the dynamic range is relatively small compared to the normal chemical photographic film using silver salt. This necessitates a subtle control of the exposure (light amount inputted into the solid-state image sensing device). Even using a sophisticated exposure control, there are sometimes the case where the dark part of the image is sensed completely black and the bright part of the image is sensed completely white (the output from the image sensing device saturates).

SUMMARY OF THE INVENTION

An object of the present invention is therefore to provide a solid-state image sensing device having a wide dynamic range.

Another object of the present invention is to make the solid-state image sensing device as small as possible so that it can be used in a compact-size video camera etc.

These and other objects are achieved by an image sensitive device of the present invention comprising: a MOS transistor having a gate, a source and a drain formed on a substrate; connecting means for electrically connecting the gate and the drain; photoelectric current generating means (such as a photodiode) for generating a photoelectric current proportional to an intensity of incident light, where the current is provided to the drain of the MOS transistor; and means for applying a voltage to the substrate of the MOS transistor in order to keep the voltage of the gate below a threshold voltage above which the MOS transistor becomes conductive between the source and the drain. The image sensitive device of the present invention is further characterized by that it outputs a signal logarithmically proportional to the intensity of light incident to the photoelectric current generating means.

Another feature of the present invention is an image sensitive device comprising: photosensitive means (such as a photodiode) for generating photoelectric current proportional to an intensity of incident light; logarithmic means for receiving the photoelectric current and generating a signal logarithmically proportional to the photoelectric current, the logarithmic means including a first MOS transistor having a gate, a source and a drain formed on a substrate; and integrating means for receiving the signal and integrating the signal for a preset period.

Other features of the present invention and specific examples of every means constituting above features of the invention is described in detail in the description of the embodiments that follow.

BRIEF DESCRIPTION OF THE ATTACHED DRAWINGS

FIG. 5C shows potential diagrams at different stages of the charge transfer in the CCD.

DETAILED DESCRIPTION OF THE PREFERRED EMBODIMENT

Before describing an embodiment of the present invention, the principle of the logarithmic compression used in the present invention is explained.

In case of a MOS (Metal Oxide Semiconductor) transistor, a small amount of current ("sub-threshold current") flows under the gate when the gate voltage is lower than the so-called threshold voltage of the MOS transistor above which the MOS transistor becomes nominally conductive between the drain and the source and below which the MOS transistor becomes nominally non-conductive. The sub-threshold current is due to a weak inversion state occurring in the surface area of the silicon substrate under the gate oxide layer, and the sub-threshold current causes various deleterious effects and therefore is thought to be undesirable characteristic of MOS transistors. The present invention uses the sub-threshold current to control the photoelectric conversion characteristic of the solid-state image sensing device.

The amount of the sub-threshold current is calculated as follows (cf. R. M. Swanson and J. D. Meindl, "Ion-implanted Complementary MOS Transistors in Low-voltage Circuits", IEEE Journal of Solid-State Circuits, Vol. SC-7, No. 2, pp. 146–153, April, 1972). When $V_G - V_S \leq V_T + n(kT/q)$ applies, the drain current $I_D$ of an n-channel MOS transistor is:

$$I_D = (Z/L)\mu_n C_o(1/m)(nkT/q)^2 \exp\{(q/nkT)(V_G - V_S - V_T - nkT/q)\} \cdot \{1 - \exp((-mq/nkT)(V_D - V_S))\} \quad (1)$$

where $V_G$, $V_D$, $V_S$, $V_T$: gate, drain, source and threshold voltages of the MOS transistor, Z: channel width of the MOS transistor, L: channel length of the MOS transistor, $\mu_n$: electron mobility, q: charge of an electron, k: Boltzman's constant, T: absolute temperature, and $C_o$: capacitance of the gate insulation layer.

In equation (1), $m = (C_o + C_d)/C_o$ $n = (C_o + C_d + C_{fs})/C_o$ $C_{fs} = qN_{fs}$ where $C_d$: capacitance of the depletion layer, and $N_{fs}$: surface state density.

When $N_{fs}$ is 0, m equals n. If $V_D - V_S \gg kT/q$, and the drain current $I_D$ of equation (1) will be:

$$I_D = I_{DO}\exp\{(q/nkT)(V_G - V_S - V_T)\} \quad (2)$$

where $$I_{DO} = (Z/L)\mu_n C_o(1/n)(nkT/q)^2 \exp(-1) \quad (3)$$

Equation (2) indicates that the drain current $I_D$ is a function of the gate-source voltage $(V_G - V_S)$ when $V_G - V_S \leq V_T + n(kT/q)$ and $V_D - V_S \gg kT/q$.

Figure 1:
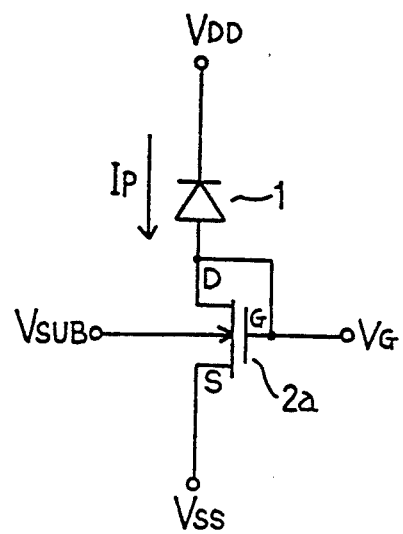
FIG. 1 is a circuit diagram of an image sensing device as the first embodiment of the present invention.

The solid-state image sensing device of the present invention makes use of the minute sub-threshold current of the MOS transistor. The first embodiment of the invention is now described referring to FIG. 1. FIG. 1 is a circuit diagram showing one pixel of the solid-state image sensing device. The pn-junction photodiode 1 is the photosensitive element, whose anode is connected to the drain D and gate G of an n-channel MOS transistor 2a. The cathode of the photodiode 1 is connected to a direct current (DC) source $V_{DD}$, the source S of the MOS transistor 2a is to another DC source $V_{SS}$, and the back gate (substrate) of the MOS transistor is to a third DC source $V_{SUB}$. Here $V_{DD} > V_{SS} \geq V_{SUB}$, i.e., the photodiode 1 is applied a reverse bias and the drain D and source S of the MOS transistor is also applied a reverse bias as to the substrate.

When light is irradiated onto the photodiode 1, photocurrent $I_P$ proportional to the intensity of the input light flows from the cathode to the anode of the photodiode 1. Since $V_D = V_G$, $$kT/q \ll V_G - V_{SS} \leq V_T + nkT/q \quad (4)$$

Hence, the current $I_D$ flowing through the MOS transistor 2a is $$I_D = I_{DO}\exp\{(q/nkT)(V_G - V_{SS} - V_T)\} \quad (5)$$

Since $I_D$ equals $I_P$ in a steady state, $$I_P = I_{DO}\exp\{(q/nkT)(V_G - V_{SS} - V_T)\} \quad (6)$$

Hence, $$V_G = V_{SS} + V_T + (nkT/q)\ln(I_P/I_{DO}) \quad (7)$$

which means that the gate voltage $V_G$ represents the logarithmic value of the photocurrent $I_P$.

The inequality (4) can be satisfied by adjusting the substrate voltage $V_{SUB}$ as follows. Equation (2) shows that the drain current $I_D$ is a function of the threshold voltage $V_T$, and the threshold voltage $V_T$ is given by:

$$V_T = \Phi_{MS} - qN_{fs}/C_o + \Phi_f + \{2\epsilon_{Si}\epsilon_o qN_B(|2\Phi_f| + V_S - V_{SUB})\}^{\frac{1}{2}}/C_o \quad (8)$$

where $\Phi_{MS}$: difference in the work function of the gate electrode and the silicon substrate, $\Phi_f$: Fermi level of the silicon substrate, $\epsilon_{Si}$: specific dielectric constant of the silicon substrate, $\epsilon_o$: dielectric constant of the vacuum, and $N_B$: impurity density in the silicon substrate.

Equation (8) shows that the threshold voltage $V_T$ changes according to $V_{SS} - V_{SUB} (= V_S - V_{SUB})$. Since the drain current $I_D$ changes according to the threshold voltage $V_T$, the substrate voltage $V_{SUB}$ can be properly adjusted to satisfy the inequality (4).

A specific example of the image sensing device is now described. The constants of the example are as follows:

$N_B = 1 \times 10^{15}/cm^3$ $Z/L = 1$ $\mu_n = 1000$ cm$^2$/V·sec $T = 300$K $C_o = 3.5 \times 10^{-8}$ F/cm$^2$ If the gate electrode is made of aluminum, $\Phi_{MS} = -0.9$ V at the impurity density $N_B$ of the substrate. Suppose, for simplicity, $C_d$, $C_{fs}$ and $N_{fs}$ are all 0 ($C_d = C_{fs} = 0$, $N_{fs} = 0$), both m and n equal 1 (m = n = 1). In this case, $I_{DO}$ is $$I_{DO} = 1000 \times 3.5 \times 10^{-8} \times 0.026^2 \times 0.368$$
$$= 8.70 \times 10^{-9}$$

and the threshold voltage $V_T$ is, when $V_S - V_{SUB} = 0$ V, $$V_T(0) = -0.9 + 0.58 + (2 \times 11.7 \times 8.85 \times 10^{-14} \times 1.6 \times 10^{-19} \times 10^{15} \times 0.58)^{\frac{1}{2}}/3.5 \times 10^{-8} = 0.08$$

and when $V_S - V_{SUB} = 5$ V, $$V_T(5) = 0.91$$

When the luminance on the surface of the photosensitive element (photodiode 1) is in the range between 0.1 1X and $10^4$ 1X, the photocurrent $I_P$ is approximately from $10^{-14}$ to $10^{-9}$ A, if the area of the photosensitive element is 100 $\mu m^2$. From equation (7), the value of $(V_G - V_{SS})$ is between $(V_T - 0.06)$ to $(V_T - 0.36)$. Specifically, when $V_S - V_{SUB} = 0$ V, $V_G - V_{SS} = 0.02$ to $-0.28$ when $V_S - V_{SUB} = 5$ V, $V_G - V_{SS} = 0.85$ to $0.55$ which shows that the inequality (4) is not satisfied when $V_S - V_{SUB} = 0$ V but is satisfied when $V_S - V_{SUB} = 5$ V. Thus it is proved that by properly adjusting the substrate voltage $V_{SUB}$, the value of the photocurrent $I_P$ can be converted into logarithmically compressed voltage value.

Figure 2:
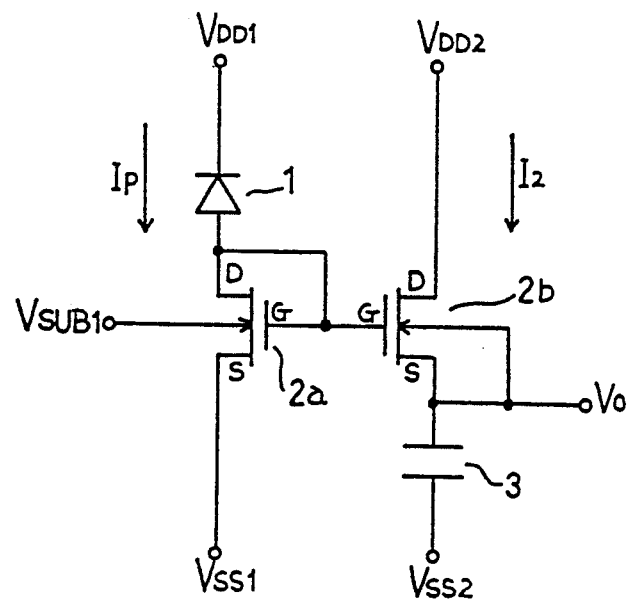
FIG. 2 is a circuit diagram of an image sensing device as the second embodiment of the present invention.

FIG. 2 shows another embodiment of the present invention in which an integral circuit is added to the first embodiment shown in FIG. 1. Here also the pn-junction photodiode 1 is the photosensitive element, and the anode of the photodiode 1 is connected to the drain and gate of a first n-channel MOS transistor 2a and the gate of a second n-channel MOS transistor 2b. DC voltage $V_{DD1}$ is applied to the cathode of the photodiode 1, $V_{SS1}$ to the source of the first MOS transistor 2a, $V_{DD2}$ to the drain of the second MOS transistor 2b. The source of the second MOS transistor 2b is connected via a capacitor 3 (capacitance=C) to a DC source $V_{SS2}$. To the substrate of the first MOS transistor 2a is connected a DC source $V_{SUB1}$. When the second MOS transistor 2b is formed on the same chip, or in the same well, as the first MOS transistor 2a, the substrate of the second MOS transistor 2b is applied the same voltage $V_{SUB1}$. When the second MOS transistor 2b is formed on a separate chip, or in a different well, from the first MOS transistor 2a, a different DC source $V_{SUB2}$ is applied to the substrate of the second MOS transistor 2b or the substrate is connected to the source of the MOS transistor 2b.

In this embodiment, as described below, the integral value of the photocurrent $I_P$ is logarithmically compressed and the compressed value is obtained as the voltage $V_o$ at the junction of the source of the second MOS transistor 2b and the capacitor 3.

In the following calculations, it is supposed that the characteristics of the first MOS transistor 2a and of the second MOS transistor 2b are the same, and the substrate of the second MOS transistor 2b is connected to its source. The voltage $V_G$ commonly applied to the gates of the first and second MOS transistors 2a and 2b is given as:

$$V_G = V_{SS1} + V_T + (nkT/q)\ln(I_P/I_{D0}) \quad (9)$$

and the current $I_2$ flowing through the second MOS transistor 2b is, from equation (2):

$$I_2 = I_{DD}\exp\{(q/nkT)(V_G - V_o - V_T)\} \quad (10)$$

Further, $$I_2 = C(dV_o/dt) \quad (11)$$

From equations (9), (10) and (11), $$C(dV_o/dt) = I_P\exp\{(q/nkT)(V_{SS1} - V_o)\}$$

or $$\exp\{(q/nkT)(V_o - V_{SS1})\}dV_o = (I_P/C)dt \quad (12)$$

Integrating the equation (12) with the condition that $V_o = V_{o1}$ at $t=0$, $$V_o = V_{SS1} + (nkT/q)\ln[(q/(nkTC))\int I_P dt + \exp\{(q/nkT)(V_{o1} - V_{SS1})\}] \quad (13)$$

Equation (13) indicates that the sum of the integral value of the photocurrent $I_P$ and a constant value determined by $V_{o1} - V_{SS1}$ is logarithmically converted. Since the constant value $\exp\{(q/nkT)(V_o - V_{SS1})\}$ decreases as $V_{o1} - V_{SS1}$ decreases, the logarithmic conversion can be more accurate when the initial value $V_{o1}$ of the voltage $V_o$ is set smaller compared to the source voltage $V_{SS1}$ of the first MOS transistor 2a.

The output voltage generated by the above described circuits can be given as charges to a CCD by the voltage balancing method (cf. Carlo H. Sequin and Michael F. Tompsett, Bell Telephone Laboratory. *Charge Transfer Devices*, New Jersey: Murray Hill) or other methods. In this case, after the charges are transferred to the CCD and the initial value of the voltage $V_o$ is set at $V_{o1}$, another round of integration should be started again. FIGS. 3A–4B show the circuits and timing charts for the output process. The pulse timing in the timing charts is based on the charge balancing method.

Figure 3A:
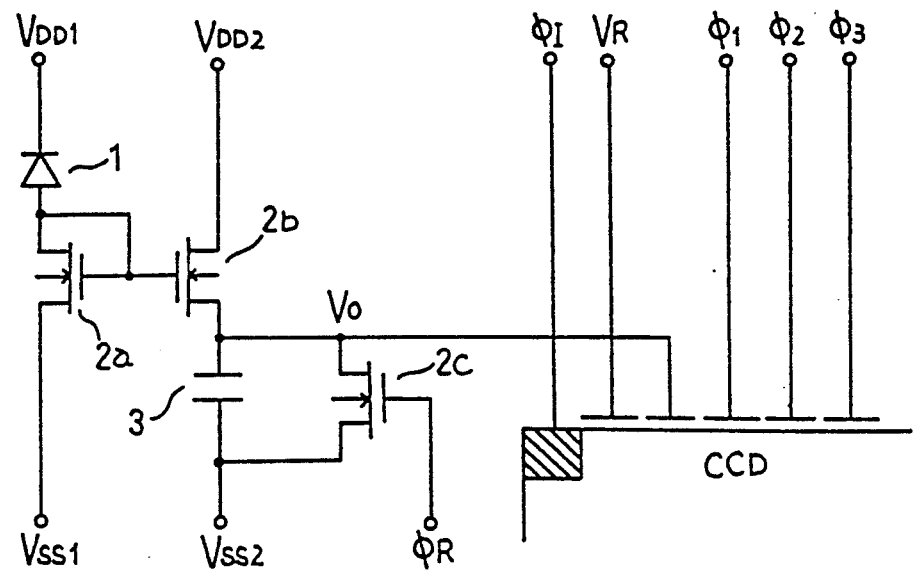
FIG. 3A is a construction diagram of the first example of an output system for the image sensing device of the second embodiment where the output signal is given to a CCD.
Figure 3B:
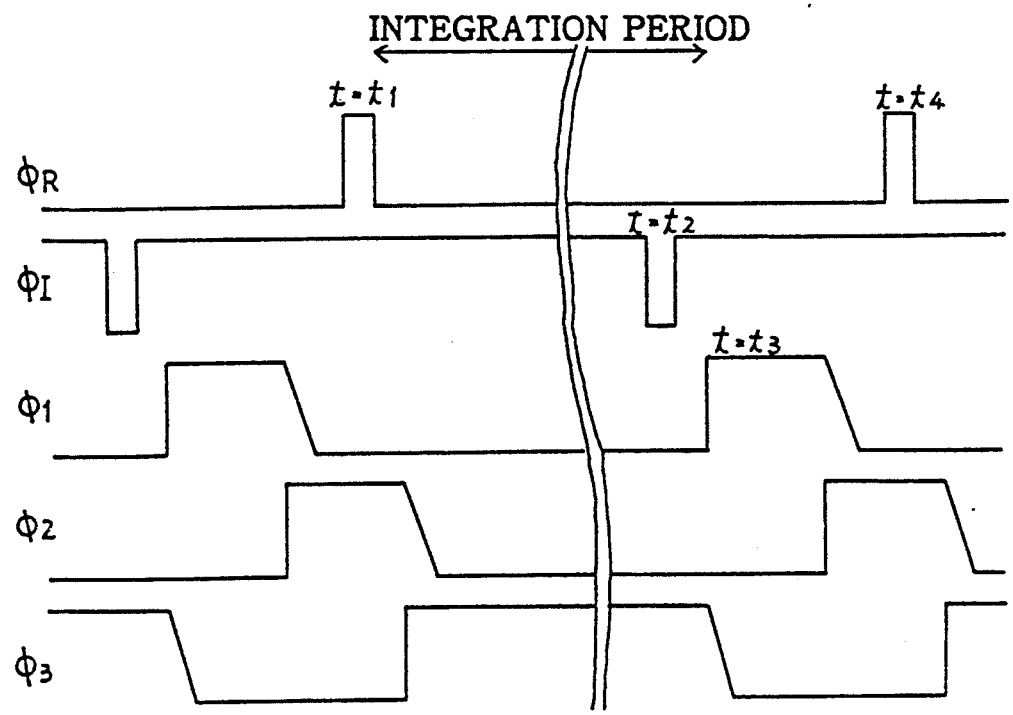
FIG. 3B is a timing chart of the driving signals for the CCD.
Figure 4A:
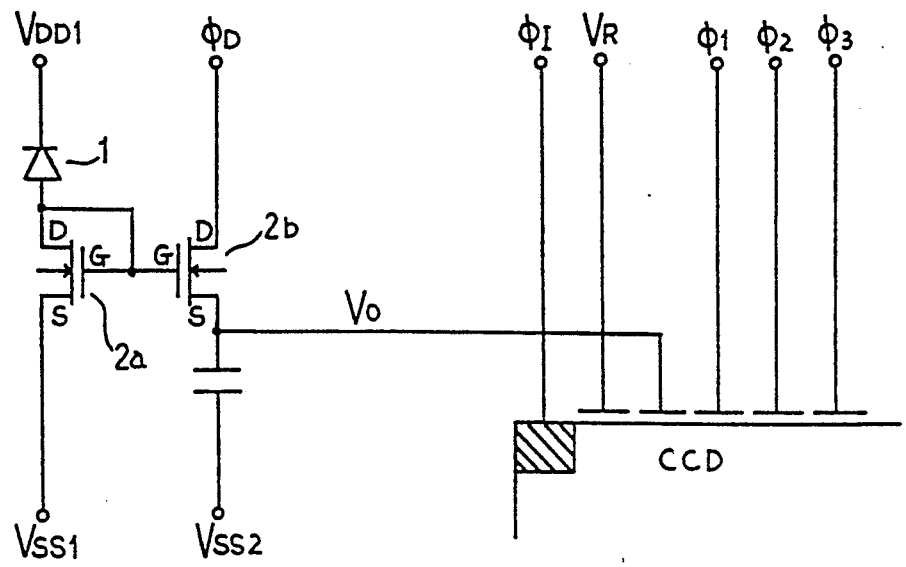
FIG. 4A is a construction diagram of the second example of an output system for the image sensing device of the second embodiment where the output signal is given to a CCD.
Figure 4B:
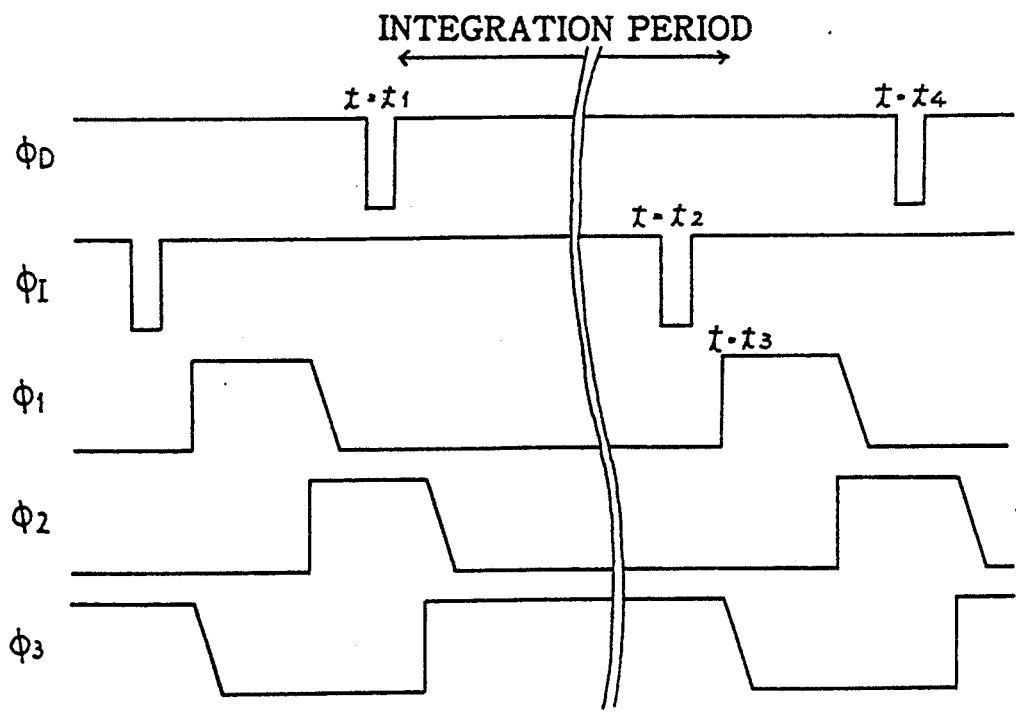
FIG. 4B is a timing chart of the driving signals for the CCD.

In FIG. 3A, a third MOS transistor 2c is used to reset the capacitor 3. In FIG. 4A, no additional transistor is used but pulse signal is given to the drain of the second MOS transistor 2b. In any case, three-phase-driven CCD is used, i.e., three pulse signals $\Phi_1$, $\Phi_2$ and $\Phi_3$ are used to transfer charges. The signal charges are injected by the difference in the voltage of the electrode applied $V_R$ (a DC voltage) and the electrode applied $V_o$.

The operation of the injection and transfer is now explained. When $\Phi_R$ becomes high (in case of FIGS. 3A and 3B) or $\Phi_D$ becomes low (in case of FIGS. 4A and 4B) at $t=t_1$, the voltage $V_o$ is set at the value $V_{SS2}$. Then the voltage $V_o$ increases according to the equation (13) (where $V_{o1} = V_{SS2}$). When $\Phi_1$ becomes low at $t=t_2$, electrical charges proportional to the value of $V_o - V_R$ are stored under the electrode applied $V_o$. When $\Phi_1$ becomes high at $t=t_3$, the stored charges are transferred under the electrode applied $\Phi_1$. Similarly, as the drive pulses $\Phi_2$ and $\Phi_3$ become high, the signal charges are transferred through the corresponding electrodes. When $\Phi_R$ returns low (in case of FIGS. 3A and 3B) or $\Phi_D$ returns high (in case of FIGS. 4A and 4B) at $t=t_4$, the voltage $V_o$ is again reset at the value $V_{SS2}$ and a new round of charge integration starts. Thus the logarithmically compressed signal is injected as signal charges into CCD and transferred in the CCD.

Figure 5A:
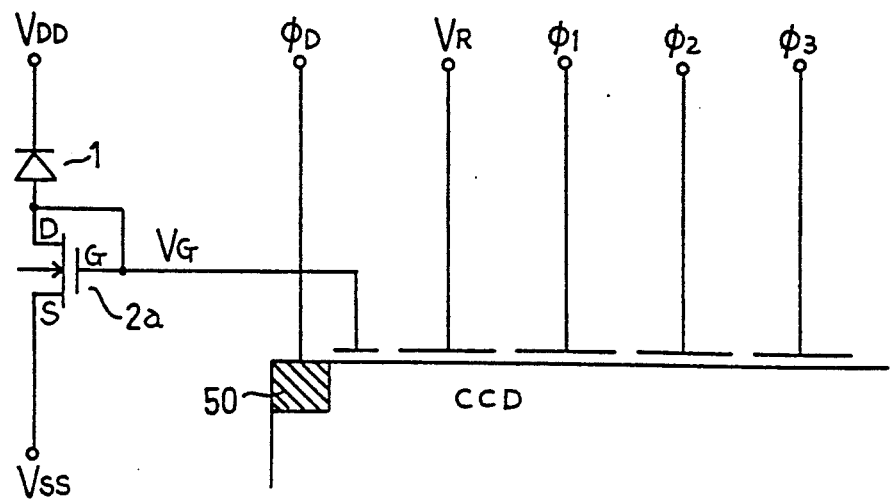
FIG. 5A is a construction diagram of the third example of an output system for the image sensing device of the second embodiment where the output signal is given to a CCD.
Figure 5B:
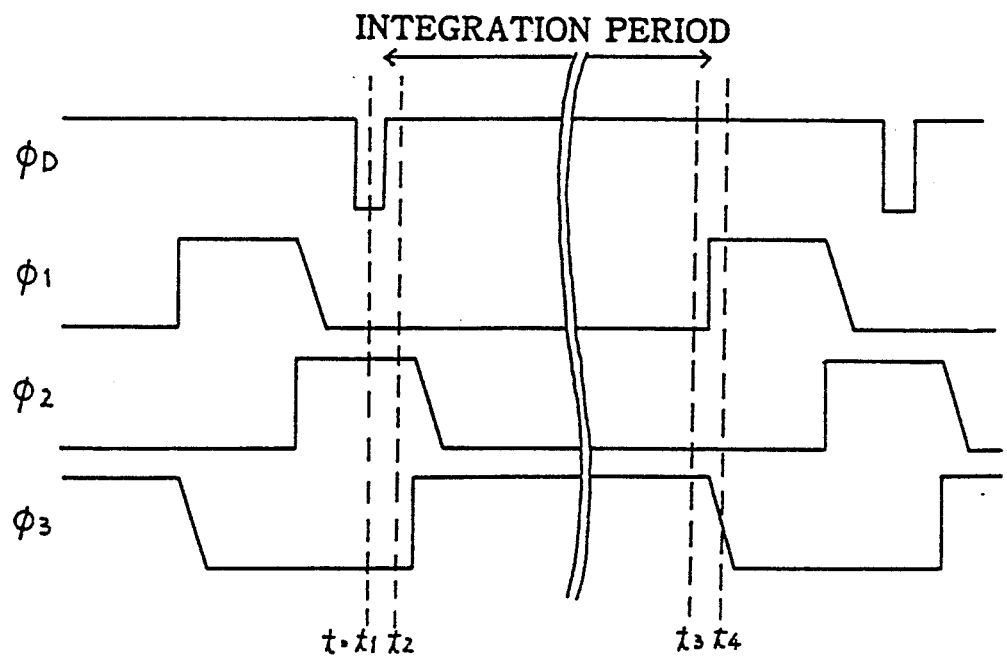
FIG. 5B is a timing chart of the driving signals for the CCD.

FIGS. 5A, 5B and 5C show still another circuit for the charge injection of the logarithmically compressed output signal. In this embodiment, the second MOS transistor 2b in FIGS. 3A and 4A is combined with the CCD. That is, as shown in FIG. 5A, the cathode of the pn-junction photodiode 1 is applied a DC voltage $V_{DD}$, and the anode of the photodiode 1 is connected to the gate and drain of the sole MOS transistor 2a and the first electrode of the CCD. DC voltage $V_{SS}$ is applied to the source of the MOS transistor 2a and $V_R$ is applied to the second electrode of the CCD. To the third electrode of the CCD is applied $\Phi_1$, to the fourth, $\Phi_2$, to the fifth, $\Phi_3$, and so on. To the input diode 50 of the CCD is applied $\Phi_D$ pulse.

Referring to the timing chart of these pulse signals in FIG. 5B and the potential diagram in FIG. 5C, the operation of the output circuit is now explained. When the pulse signal $\Phi_D$ becomes low at $t=t_1$, the electrons are injected into the region under the electrode $V_R$ through the region under the electrode $V_G$. When the pulse signal $\Phi_D$ becomes high at $t=t_2$, the excessive electrons return to the input diode. These are the resetting operation, and then a new round of integration starts. At this condition, the electrons under the electrode $V_R$ are drained through the region under the electrode $V_G$ to the input diode 50. This means that a current flows from the input diode 50 to the region under the electrode $V_R$, and the amount of the current is the exponential function of the voltage difference between $V_G$ and $V_R$. In this embodiment, the input diode 50 of the CCD corresponds to the drain of the second MOS transistor 2b and in FIG. 4A, and the electrons stored under the second gate of the CCD correspond to the charges stored in the capacitor connected to the source of the second MOS transistor 2b and in the source of the second MOS transistor 2b. After the integration is finished at $t=t_3$, the pulse signal $\Phi_1$ becomes high at $t=t_4$ and the electrons stored under the electrode $V_R$ are transferred to the CCD.

The high speed operation of the embodiment is now explained. A stray capacitance exists around the gate of the first MOS transistor 2a. In order to cope with a high speed operation and adequately follow the change in the photocurrent $I_P$, the stray capacitance must charge or discharge in a sufficiently short time compared to the integration time. Since the gate and the drain are connected to each other in the first MOS transistor 2a in FIG. 2, the discharging of the stray capacitance (where the photocurrent $I_P$ changes from a larger value to a smaller value) is done by the first MOS transistor 2a. But the charging of the stray capacitance (where the photocurrent $I_P$ changes from a smaller value to a larger value) must be done by the photocurrent $I_P$, which takes longer time than in the case of charging.

Figure 6:
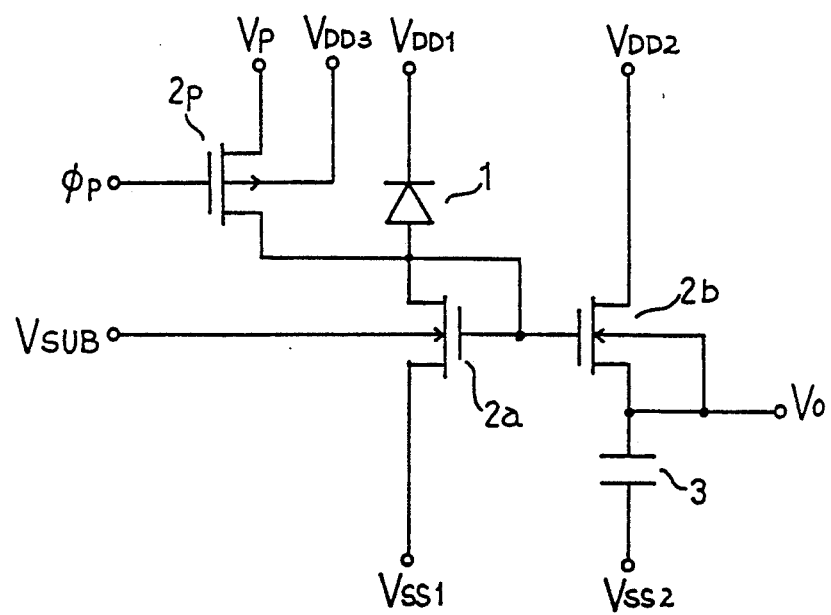
FIG. 6 is a circuit diagram of an image sensing device added a pre-charge circuit to the circuit of the second embodiment.

The embodiment shown in FIG. 6 addresses the problem, where a pre-charge transistor 2p is added. The pre-charge transistor 2p is connected to the gate of the first MOS transistor 2a. Before starting an integration, the pre-charge transistor 2p is turned on (i.e., become conductive) by a pre-charge pulse $\Phi_P$, whereby the voltage at the gate of the first MOS transistor 2a becomes high. When the integration starts, the first MOS transistor 2a is in a discharging state and the proper gate voltage corresponding to the photocurrent can be obtained at a shorter time.

Figure 7A:
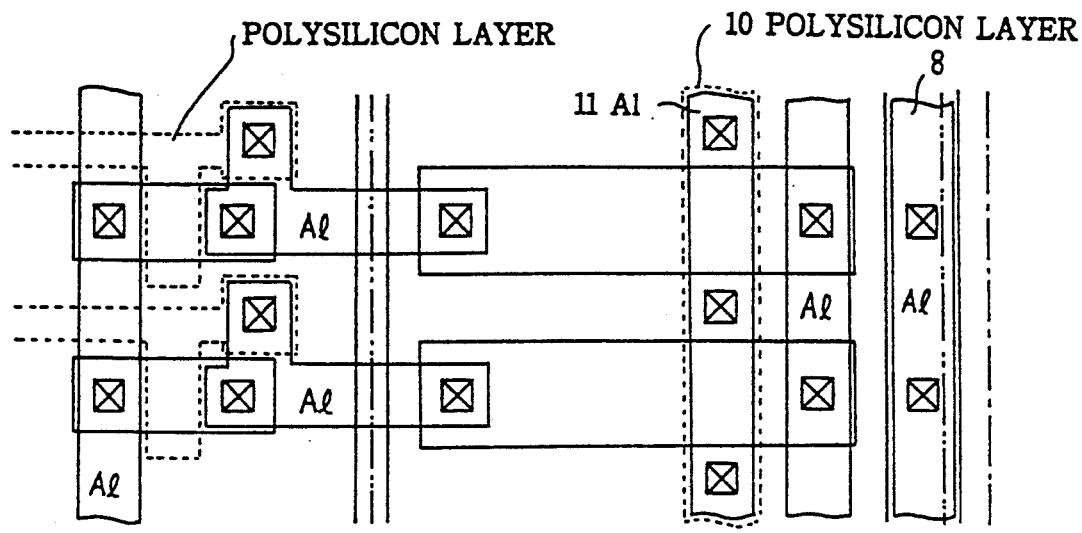
FIG. 7A is an example of concrete structure of the image sensing device of the circuit as shown in FIG. 6.
Figure 7B:
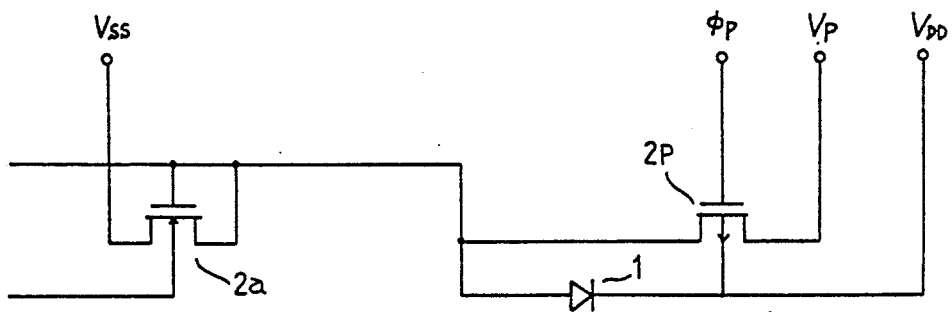
FIG. 7B is the circuit diagram.
Figure 7C:
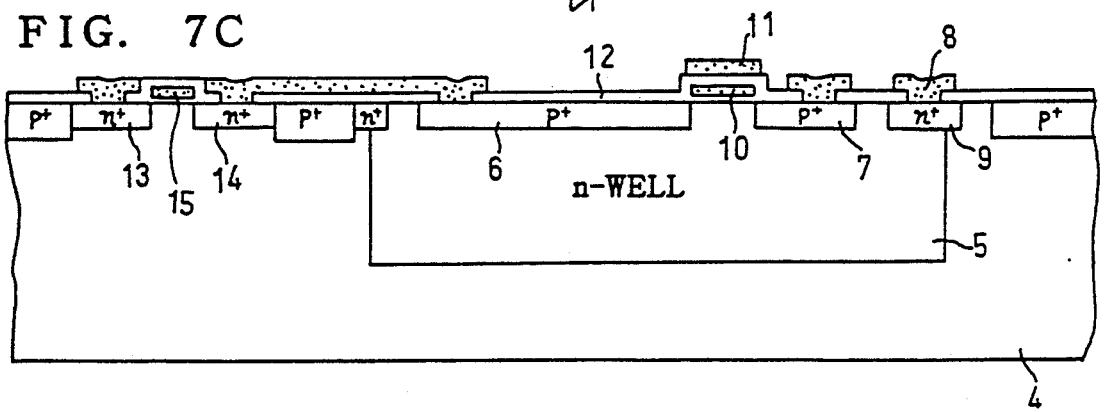
FIG. 7C is the cross-sectional view of the structure.

In FIGS. 7A–7C, the pre-charge transistor 2p in FIG. 6 is realized by a p-channel MOS transistor. In this specific example, the drain of a p-channel MOS transistor is used as the anode of a photodiode. The structure of the example is as follows. In a p-substrate 4, an n-well region 5 is formed, which will be the cathode of a photodiode 1. On the n-well region 5, a P+-region 6 is formed by the diffusion method, which will be the anode of the photodiode. A p-channel MOS transistor 2p is formed on the n-well region 5, where the P+-region 6 (which is used as the anode of the photodiode) is used also as the drain of the p-channel MOS transistor 2p. Another P+-region 7 is formed on the n-well region 5, and is used as the source of the p-channel MOS transistor 2p. A DC voltage $V_{DD}$ is applied to the n-well 5 through an aluminum electrode 8 and an n+-region 9, DC voltage $V_P$ is applied to the source 7 of the p-channel MOS transistor 2p, and a pre-charge pulse signal $\Phi_P$ is input into the gate of the transistor 2p through an appropriate electrode 10. On other regions of the substrate 4 are formed an n-channel MOS transistor 2a (with a source 13 and drain 14 formed by n+-regions and a gate 15 therebetween) and a CCD. Here the circuit as shown in FIGS. 1–5A is completed. An aluminum line 11 is placed (via an insulation layer 12) on the gate electrode 10 in order to decrease the resistance of the gate line which is formed by polysilicon.

As described above in detail, the image sensing device according to the present invention can generate an electrical signal whose value is proportional to the logarithm of the intensity of input light. That is, the large dynamic range of the input light is effectively compressed to become a smaller signal output range. Since the logarithmic compression is performed in the photoelectric converting section of the image sensing device, the overall dynamic range of the image sensing device is not restricted by the dynamic range of the signal transfer section that transfers the signal charges to the output terminal of the device. Further, the image sensing device of the present invention can be highly integrated because the device uses MOS transistors, and it is still possible to form a CCD on the same chip.

What is claimed is:

1. An image sensitive device, comprising:
   a first MOS transistor having a gate, a source and a drain, said first MOS transistor operating in a subthreshold region;
   a second MOS transistor having a gate, a source and a drain, said second MOS transistor operating in a subthreshold region, and said gate of the second MOS transistor being connected to the gate and drain of the first MOS transistor;
   photoelectric current generating means for generating a photoelectric current proportional to an intensity of incident light, said photoelectric current being provided to the drain of the first MOS transistor; and
   a capacitor connected to the source of the second MOS transistor; wherein a voltage resulting from a connection between the source of the second MOS transistor and the capacitor is logarithmically proportional to an integrated amount of the photoelectric current.

2. An image sensitive device as claimed in claim 1, wherein a pulse signal is applied to the drain of the second MOS transistor so that the second MOS transistor initializes the voltage of the connection between the source of the second MOS transistor and the capacitor.

3. An image sensitive device, comprising:
   a MOS transistor having a gate, a source and a drain, said MOS transistor operating in a subthreshold region;
   photoelectric current generating means for generating a photoelectric current proportional to an intensity of incident light, said photoelectric current being provided to the drain of the MOS transistor;
   a charge-coupled device whose first gate is connected to the gate and drain of the MOS transistor; and
   means for applying a direct-current voltage to a second gate of the charge-coupled device; wherein an amount of charge stored under the second gate of the charge-coupled device is logarithmically proportional to an integrated amount of the photoelectric current.

4. An image sensitive device as claimed in claim 3, wherein an input diode is provided in the charge-coupled device, and a pulse signal is applied to the input diode to initialize the charge stored under the second gate of the charge-coupled device.

* * * * *